United States Patent
Yang et al.

(10) Patent No.: US 7,187,583 B2
(45) Date of Patent: Mar. 6, 2007

(54) METHOD FOR REDUCING DATA ERROR WHEN FLASH MEMORY STORAGE DEVICE USING COPY BACK COMMAND

(75) Inventors: Jiunn-Yeong Yang, Taipei (TW); Cheng-Hui Yang, Taipei (TW)

(73) Assignee: Phison Electronics Corp., Hsinchu Hsien (TW)

( * ) Notice: Subject to any disclaimer, the term of this patent is extended or adjusted under 35 U.S.C. 154(b) by 127 days.

(21) Appl. No.: 10/905,867

(22) Filed: Jan. 25, 2005

(65) Prior Publication Data

US 2006/0164885 A1    Jul. 27, 2006

(51) Int. Cl.
*G11C 16/06*    (2006.01)

(52) U.S. Cl. .................... 365/185.09; 365/189.05; 365/185.33

(58) Field of Classification Search ........... 365/185.09, 365/189.05, 185.33
See application file for complete search history.

(56) References Cited

U.S. PATENT DOCUMENTS

| 5,838,614 | A | * | 11/1998 | Estakhri et al. | ........ | 365/185.11 |
| 6,069,827 | A | * | 5/2000 | Sinclair | ................. | 365/185.33 |
| 6,728,851 | B1 | * | 4/2004 | Estakhri et al. | ........ | 365/189.04 |

* cited by examiner

*Primary Examiner*—Tuan T. Nguyen

(57) ABSTRACT

A method of a flash memory storage device using a copy back command is provided. An error correction rule is adopted to determine whether or not data errors occurred in the un-amended data stored in the page, wherein when it is determined that data errors has occurred in the un-amended data, then a data transfer command is executed, thereby enabling the flash memory storage device to use the block having a faster transferring speed to executing the copy back command. Thus, the data in the flash memory storage device is not only correct and complete but also the stability of the system is promoted.

4 Claims, 3 Drawing Sheets

METHOD FOR REDUCING DATA ERROR WHEN FLASH MEMORY STORAGE DEVICE USING COPY BACK COMMAND

BACKGROUND OF THE INVENTION

1. The Field of the Invention

The present invention provides a method for reducing data error when a flash memory using a copy back command, and more particularly, to a method for reducing data errors when a flash memory storage device using a copy back command.

2. Description of Related Art

Flash memories are widely popular because of its advantageous characteristics, such as nonvolatile, shock proof, high memory density and the like. Among many portable devices, the flash memory has replaced the EEPROM or the memory which requires battery power for its operation. Because the semiconductor technology is mature, it is possible to increase both the storage density and transmission speed of the flash memory, and therefore of flash memory has gradually replaced the conventional storage media, such as the hard disk driver. Because of the advantageous characteristics of the flash memory, the flash memories are widely applied in flash memory storage device by many manufacturers. The flash memory storage device enables the user to readily input and retrieve data and thereby provides great convenience and advantages to the users compared to the conventional storage device, such as the hard disk. Accordingly, the flash memory storage device has become the mainstream of storage device and most demanding on the present market.

The above-mentioned flash memory storage device use a copy back command to process the data amendment of a block during the data transmission. FIG. 1 is a flowchart showing a conventional flash memory storage device while executing the copy back command. When a part of data of a block needs to be amended, the conventional flash memory storage device A locates a new block A2 for inputting a part of data which needs to be amended, and then copy the data from the old block A1, that need not be amended, into the new block A2 to complete the copy back command. However, data errors may occur while the flash memory storage device A uses the block to execute the copy back command and the amount of data errors may be beyond the detectable range.

For ensuring the correctness and completeness of the data in the flash memory storage device, some manufacturers developed an error correction rule to calculate the value of the error correction code. Thus, when the microprocessor demands data from the flash memory storage device, first, the value of the error correction code for one or plural existing error bytes is detected; the error correction rule corrects the bytes if one or more error bytes exist. However, the error correction rule in the conventional flash memory storage device cannot correct if the amount of data errors exceed beyond the data correction capacity. Therefore, during the data transmission, if the amount of data errors exceed beyond the data correction capacity, the block in which the data is located is treated as a bad block and the data transmission is disabled. This phenomenon would adversely affect the system stability and cause inconvenience to the users.

Therefore, to prevent data errors from occurring due to use of copy back command of the flash memory storage device, most of the manufacturers prefer to abandon the copy back command. However, to abandon the copy back command means loosing the advantage of faster data transmission as this command allows partial amendment of data in a block.

Therefore, it is highly desirable to resolve data error problems when the flash memory storage device using copy back command

SUMMARY OF THE INVENTION

Accordingly, in the view of the foregoing, the present inventor makes a detailed study of related art to evaluate and consider, and uses years of accumulated experience in this field, and through several experiments, to create a new method of a flash memory using the copy back command. The present invention provides an innovated cost effective method of the flash memory using the copy back command to effectively reducing the problems of the conventional art described above.

According to an aspect of the present invention, the error correction rule is adopted to determine whether or not data errors occurred in the un-amended data stored in the page, wherein when it is determined that data errors has occurred in the un-amended data, then the data is transferred by executing a data transfer command, and when it is determined that no data errors occurred, the un-amended data is transferred by executing the copy back command, thereby enabling the flash memory to use a block having a faster transferring speed to execute the copy back command. Thus, the data in the flash memory is not only correct and complete but also the stability of the system is promoted. Thus, the method of the present invention allows the user can securely maintain the data in the flash memory.

BRIEF DESCRIPTION OF THE DRAWING

For a more complete understanding of the present invention, reference will now be made to the following detailed description of preferred embodiments taken in conjunction with the accompanying drawings, in which.

DETAILED DESCRIPTION OF PREFERRED EMBODIMENTS

Figure 1:
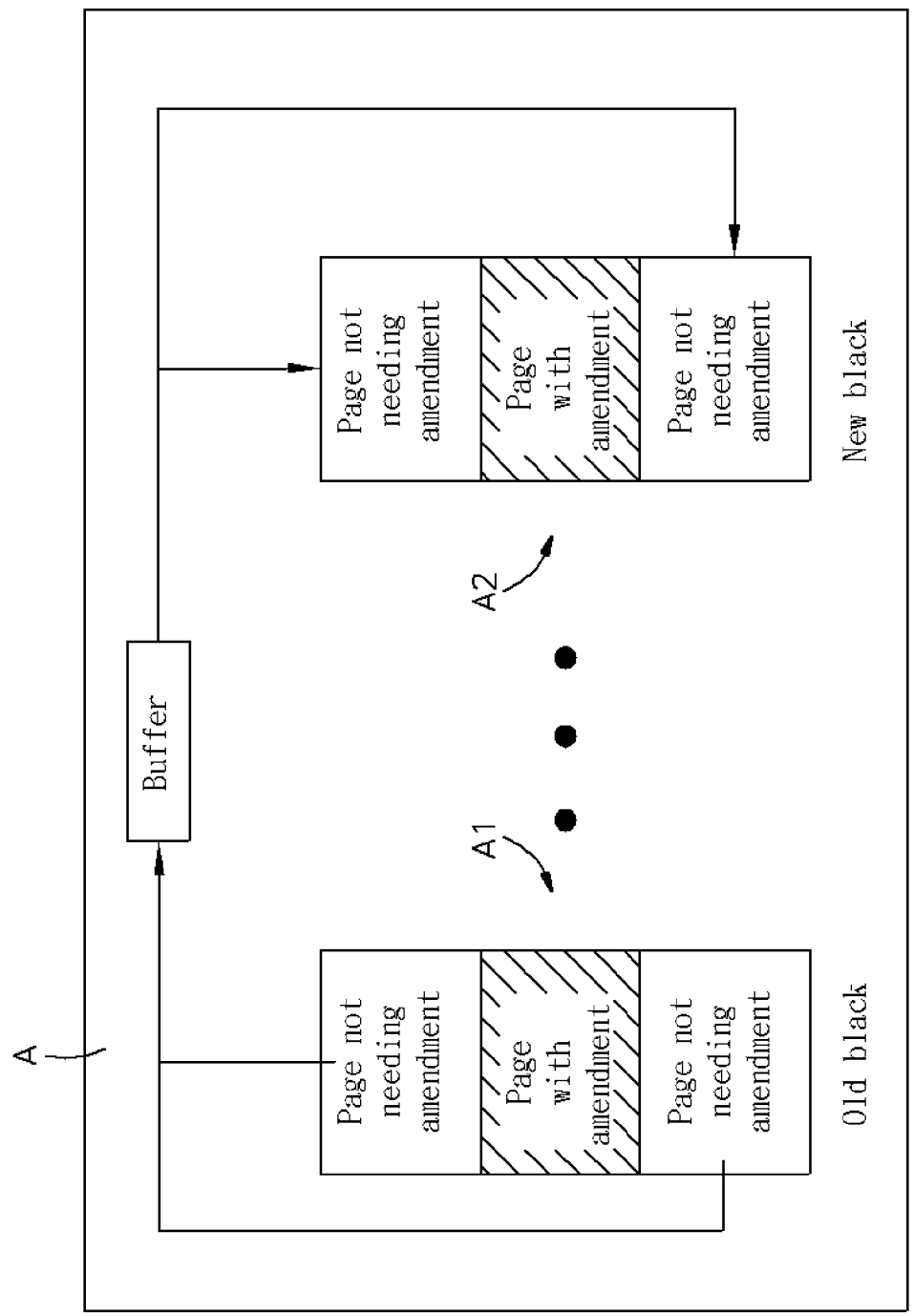
FIG. 1 is a flowchart showing a conventional flash memory storage device while executing the copy back command.
Figure 2:
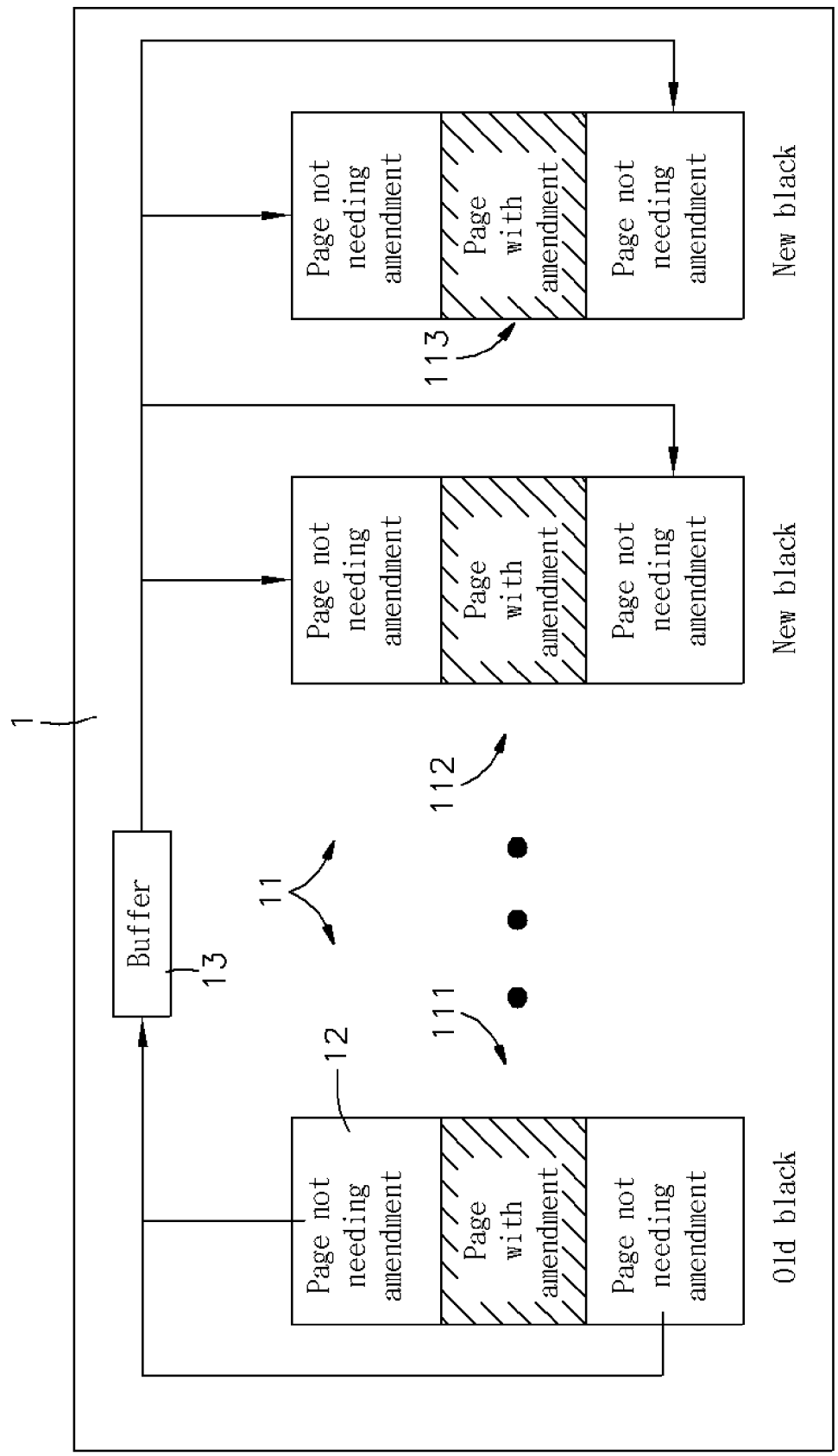
FIG. 2 is a flowchart showing a flash memory storage device while executing the copy back command according to an embodiment of the present invention.

Referring to FIG. 2, a flash memory storage device 1 comprises a plurality of blocks 11, wherein each of the blocks 11 comprises a plurality of pages 12 for storing data therein. Each block 11 is connected to a buffer 13. When the flash memory storage device 1 executes a copy back command, first, the block 11 having data that need to be amended is defined as an old block 111, and a new block is located and defined as a new block 112. The flash memory storage device 1 transfers the data that does not need to be amended to the buffer 13 and the buffer 13 writes the data into the corresponding page 12 in the new block 112 to complete the copy back command. When the copy back command is completed, the flash memory storage device 1 reads the page 12 with the un-amended data of the new block 112, and uses the error correction rule to determine whether any data errors occurred in the un-amended data stored in the page 12 of the new block 112 so as to prevent the amount of the data errors from executing the copy back command beyond the correction capacity of the error correction rule. Thus, the data can be rapidly and stably transferred.

Figure 3:
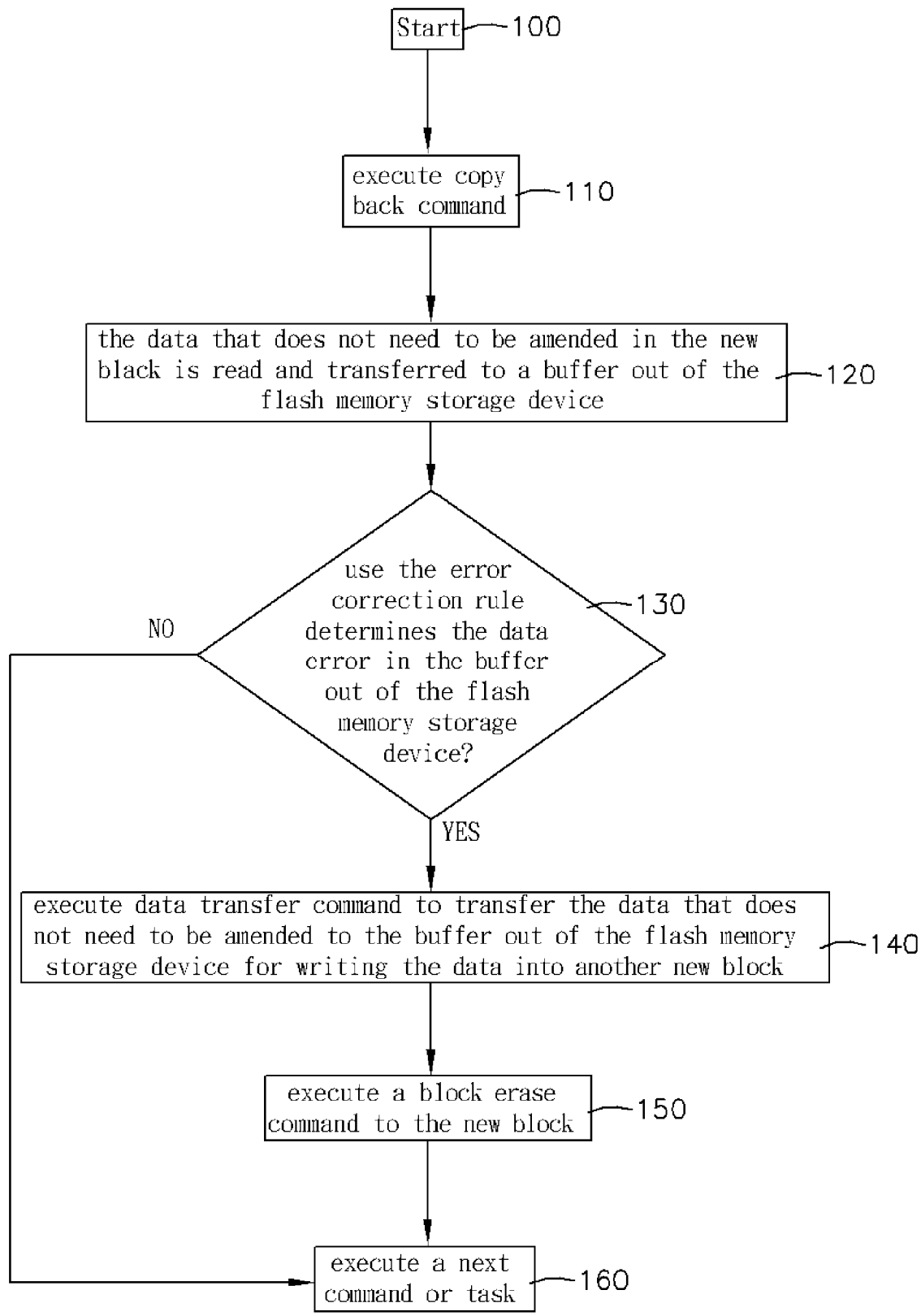
FIG. 3 is a view showing a flash memory storage device while executing the copy back command according to an embodiment of the present invention.

Referring to FIGS. 2 and 3, the flash memory storage device 1 executes the copy back command as follows:

At step 100, the flash memory storage device storage device 1 is started.

At step 110, the copy back command is executed, wherein a block 11 having data that need to be amended is defined as an old block 111, and the data that does not need to be amended is transferred to a buffer 13 for writing into a corresponding page 12 in a new block 112.

At step 120, the un-amended data in the page 12 of the new block 112 is read and transferred to a buffer out of the flash memory storage device 1.

At step 130, whether any data errors occurred in the buffer out of the flash memory storage device 1 is determined via error correction rule, and if any data errors occurred, step 140 is executed if not, step 160 is executed.

At step 140, a data transfer command is executed to transfer the un-amended data in the old block 111 to the buffer out of the flash memory storage device 1 for writing the data into another new block 113.

At step 150, a block erase command is executed to the new block 112.

At step 160, a next command or task is executed.

The above error correction rule can be Hamming Code or Reed Solomon Code, or any other error correction code.

Accordingly, the method of the flash memory storage device using the copy back command, according to the present invention, is capable of effectively preventing the possibility of data errors, wherein the error correction rule is used to determine whether the data errors occurred in un-amended data stored in the page, and thereby prevent the amount of data errors from executing the copy back command beyond the data correction capacity of the error correction rule. Thus, enable the flash memory storage device to use the block having the faster transferring speed to execute the copy back command for partial data amendment. Thus, the data in the flash memory storage device is not only correct and complete but also the stability of the system is promoted. Thus, the method of the present invention allows the user can securely maintain the data in the flash memory storage device.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting.

What is claimed is:

1. A method of a flash memory storage device using a copy back command, the method comprising the steps of:
    (a) starting;
    (b) executing a copy back command, wherein the data that does not need to be amended in an old block is transferred to a buffer for writing into a new block;
    (c) reading the un-amended data in the new block to a buffer out of the flash memory storage device;
    (d) using an error correction rule to determine whether or not data errors occurred in the buffer out of the flash memory storage device, wherein when it is determined that data errors occurred, the following step (e) is executed, and wherein when it is determined that no data errors occurred, the following step (g) is executed;
    (e) using a data transfer command to transfer the un-amended data in the old block to the buffer out of the flash memory storage device for writing the data into another new block;
    (f) executing a block erase command to the new block; and
    (g) executing a next command or task.

2. The method of a flash memory storage device using a copy back command according to claim 1, wherein when it is determined that no data errors occurred in step (d), the step (g) is executed.

3. The method of a flash memory storage device using a copy back command according to claim 1, wherein said error correction rule is a Hamming Code.

4. The method of a flash memory storage device using a copy back command according to claim 1, wherein said error correction rule is Reed Solomon Code.

* * * * *